United States Patent [19]

Shimizu

[11] Patent Number: 5,751,145
[45] Date of Patent: May 12, 1998

[54] MR IMAGING METHOD AND APPARATUS WITH WATER SIGNAL SUPRESSION

[75] Inventor: Koji Shimizu, Kyoto, Japan

[73] Assignee: Shimadzu Corporation, Kyoto, Japan

[21] Appl. No.: 689,786

[22] Filed: Aug. 13, 1996

[30] Foreign Application Priority Data

Aug. 21, 1995 [JP] Japan .................................. 7-236138

[51] Int. Cl.⁶ .................................................. A01B 5/055
[52] U.S. Cl. .......................................... 324/309; 324/307
[58] Field of Search ................................. 324/300, 307, 324/309; 128/633.1, 653.2

[56] References Cited

PUBLICATIONS

Magnetic Resonance in Medicine, vol. 28, 1992, pp. 153–162, XP 000651579, "Use of Fluid–Attenuated Inversion–Recovery Pulse Sequences for Imaging the Spinal Cord", White et al.

American Journal of Neuroradiology, vol. 13, 1992, pp. 1555–1564, XP000651587, MR of the Brain Using Fluid–Attenuated Inversion Recovery (FLAIR) Pulse Sequences, DeCoene et al.

*Primary Examiner*—Sandra L. O'Shea
*Assistant Examiner*—Michael Eisenberg
*Attorney, Agent, or Firm*—Nikaido, Marmelstein, Murray & Oram LLP

[57] ABSTRACT

An MR imaging method using NMR phenomenon and including the following steps: emitting a first group of RF pulses including a first inversion RF pulse, and excitation RF pulses emitted to excite a plurality of slices in a predetermined order; emitting slice-selecting gradient field pulses; emitting phase-encoding gradient field pulses; collecting a first group of echo signals; emitting a second group of RF pulses including a second inversion RF pulse having substantially the same frequency band as the first inversion RF pulse, and second excitation RF pulses emitted to excite the plurality of slices in a reverse order; emitting slice-selecting gradient field pulses; emitting phase-encoding gradient field pulses; collecting a second group of echo signals; repeating this pulse sequence while varying the phase-encoding gradient field pulses; adding two data corresponding to each slice, which data are included, respectively, in a first group of data and in a second group of data, thereby forming a new group of data; and reconstructing slice images.

10 Claims, 11 Drawing Sheets

Fig. 1 (PRIOR ART)
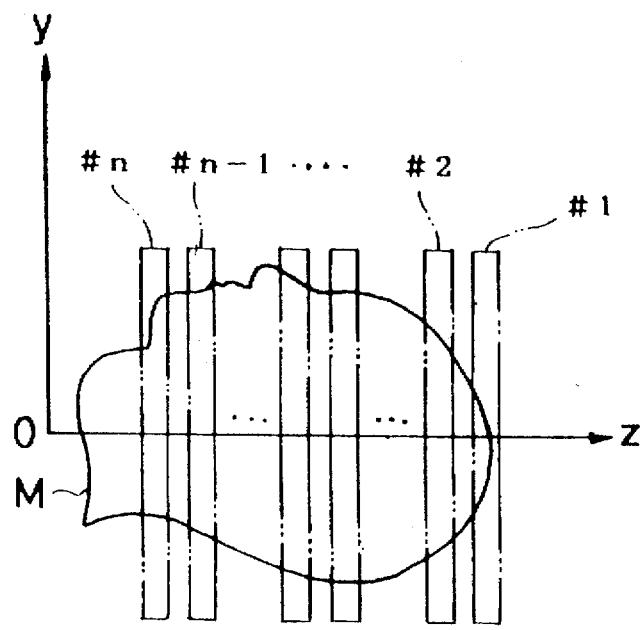
(PRIOR ART)
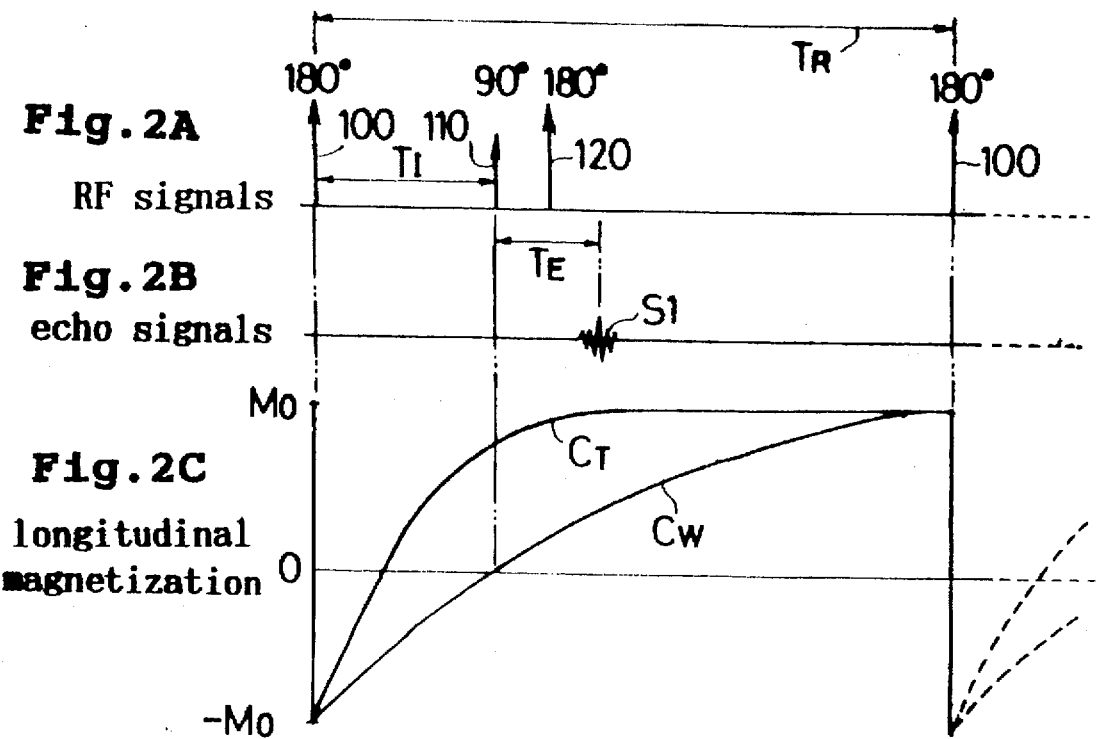

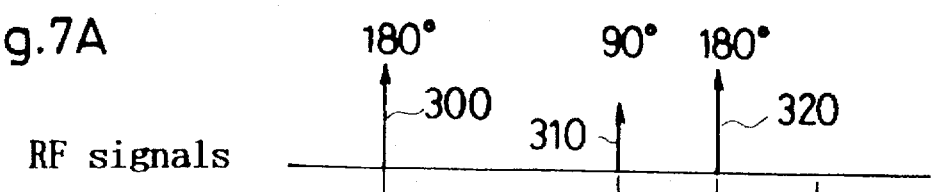
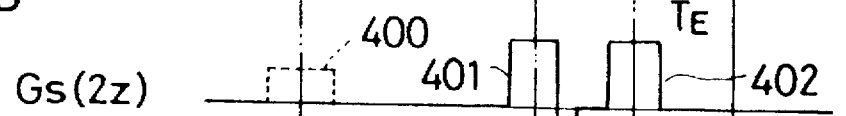
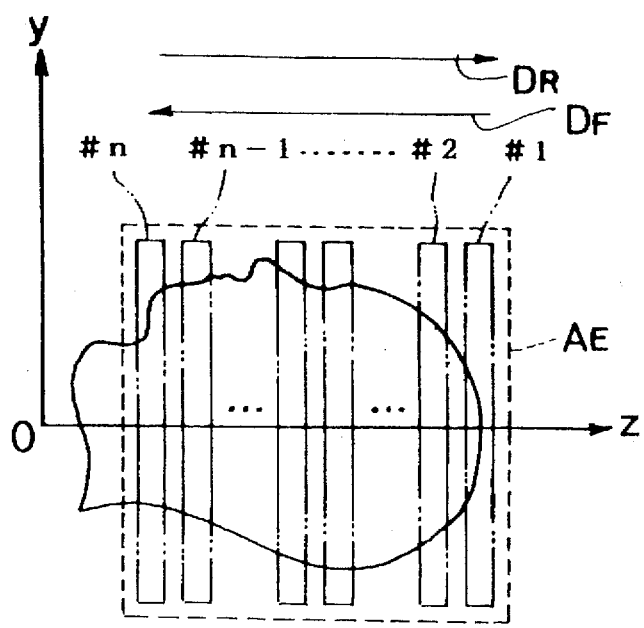

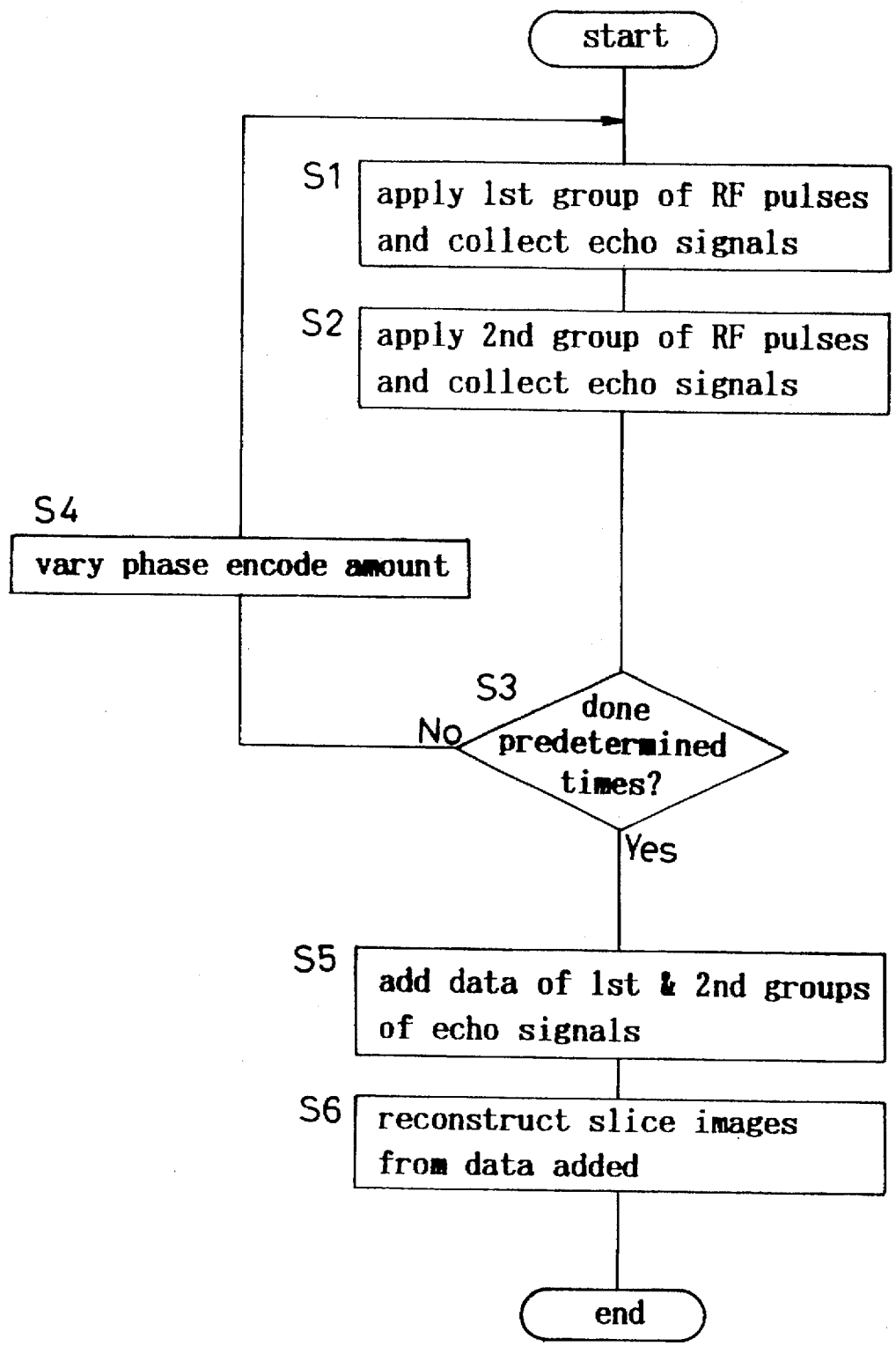

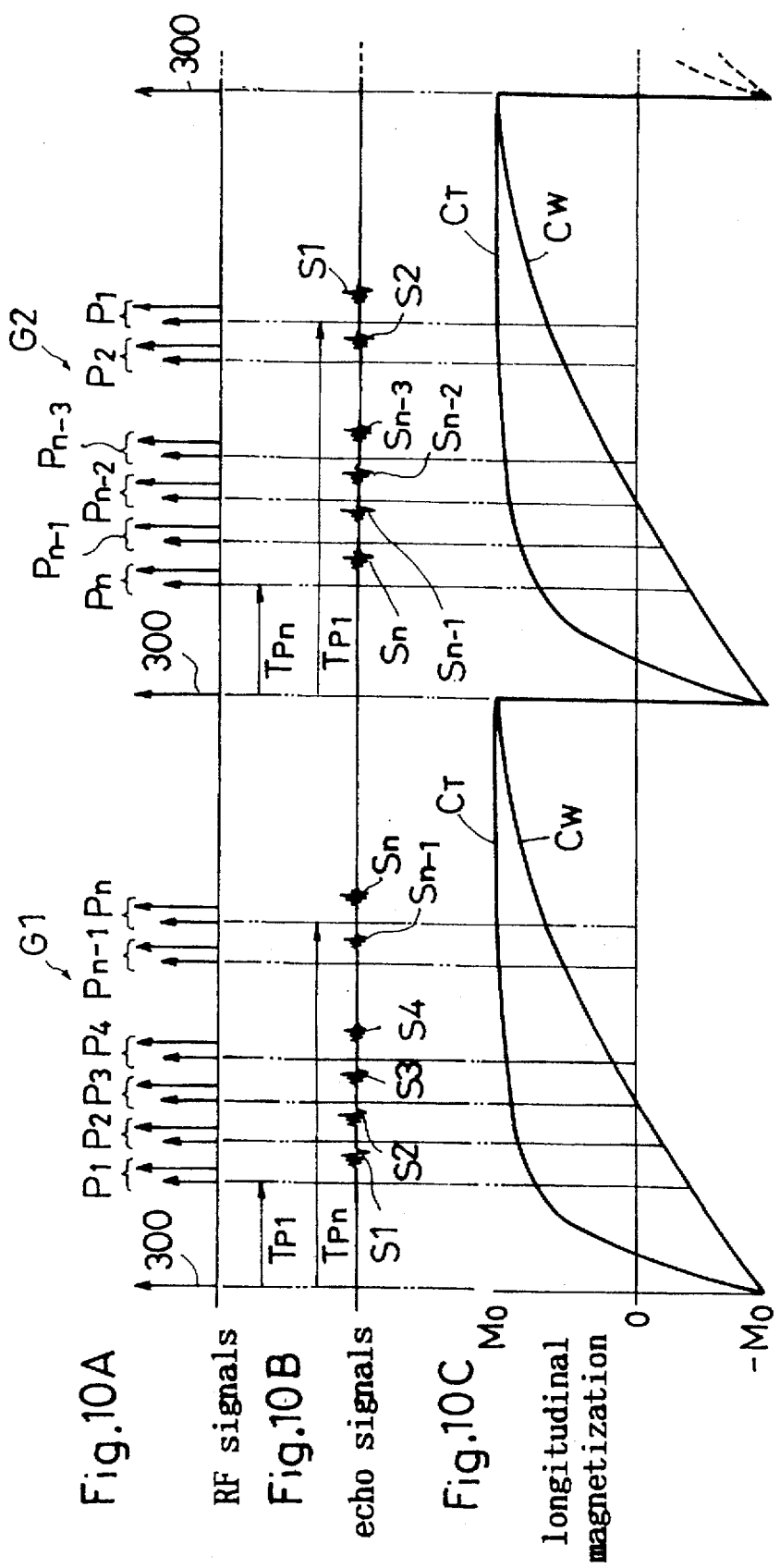

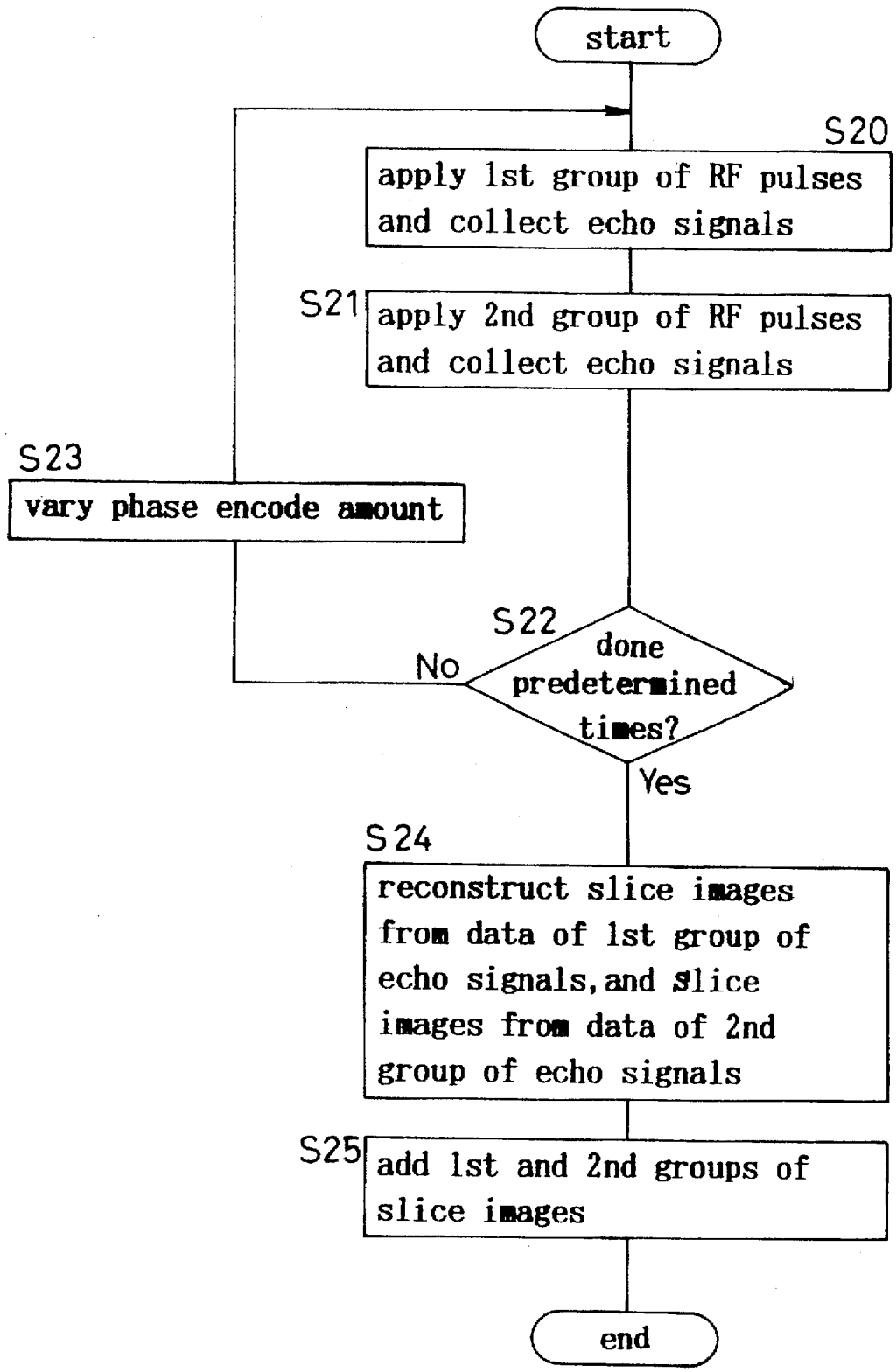

MR IMAGING METHOD AND APPARATUS WITH WATER SIGNAL SUPRESSION

BACKGROUND OF THE INVENTION (1) Field of the Invention

This invention relates to MR imaging methods and apparatus using NMR (nuclear magnetic resonance). More particularly, the invention relates to an imaging technique by FLAIR (Fluid Attenuated Inversion Recovery), which is a pulse sequence based on IR (Inversion Recovery), for obtaining T2-weighted images with suppressed water signal strength. With this imaging technique, a plurality of slice images are picked up by simultaneously irradiating slices with an inversion RF pulse as a slice non-selective pulse for inverting proton spins.

(2) Description of the Related Art

Conventional MR imaging apparatus for executing such a pulse sequence based on FLAIR include an apparatus (first apparatus) which applies an inversion RF pulse as a slice selective pulse, and an apparatus (second apparatus) which applies an inversion RF pulse as a slice non-selective pulse.

The first apparatus will be described first with reference to FIGS. 1 through 3. FIG. 1 is a schematic view showing slices. FIGS. 2A through 2C are a time chart illustrating the FLAIR technique. FIG. 3 is a time chart showing a pulse sequence by the FLAIR technique. In FIGS. 2 and 3, gradient field pulses are omitted for expediency of description.

Referring to FIG. 1, reference M denotes an examinee, particularly his or her head, lying with the body axis extending substantially in the z-direction. Reference #1 denotes a first slice, #2 a second slice, #n−1 an (n−1)th slice, and #n an nth slice.

In the FLAIR technique, as shown in FIGS. 2A–2C, an inversion RF pulse 100 is applied for selectively inverting 180 degrees all spins of protons included only in the first slice #1 (FIG. 2A). Upon lapse of inversion recovery time TI (also called delay time, and TI=1600 to 2000 ms, for example) from the inversion RF pulse, an excitation RF pulse 110 is applied to rotate 90 degrees all the spins of protons included only in the first slice #1. Upon lapse of a predetermined time from the excitation RF pulse 110, a refocus RF pulse 120 is applied to rotate 180 degrees all the spins in the first slice #1. By applying these RF pulses to the examinee M, an echo signal S1 is generated around a point of time twice the predetermined time TE from the excitation RF pulse 110 (FIG. 2B).

As shown in FIG. 2C, the spins of protons irradiated with the inversion RF pulse 100 have their longitudinal magnetization inverted from M0 to −M0. Subsequently, the longitudinal magnetization returns to M0 with a time constant (usually a longitudinal relaxation time expressed by T1) of longitudinal relaxation time (also called spin-lattice relaxation time). The longitudinal relaxation time T1 is different for "tissue" such as fat tissue, cerebral white matter and cerebral gray matter and for "water" (free water) such as cerebrospinal fluid. The longitudinal relaxation time is longer for "water" than for "tissue". In FIG. 2C, the longitudinal relaxation of "tissue" follows a longitudinal relaxation curve CT and is completed early. The longitudinal relaxation of "water" follows a gentle curve CW and is completed late.

In the FLAIR technique, the excitation RF pulse 110 is applied, i.e. the inversion recovery time TI is set to elapse, at a point of time the longitudinal magnetization of "water" is substantially zero, in order to obtain a T2-weighted image by suppressing the signal strength of "water". With such setting, the echo signal S1 contains relaxation information having a sufficiently large longitudinal magnetization of "tissue" and a sufficiently small longitudinal magnetization of "water". This results in a T2-weighted image with suppressed water signal strength when the TE is set to be long.

In an actual situation, a pulse sequence as shown in FIG. 3, for example, is executed to collect echo signals from a plurality of slices #1-#n as shown in FIG. 1. That is, the echo signal S1 is generated by applying the inversion RF pulse 100 for inverting the first slice #1, applying the excitation RF pulse 110 upon lapse of inversion recovery time TI, and then applying the refocus RF pulse 120. In order to make effective use of the inversion recovery time TI (e.g. TI=1600 to 2000 ms, which is an idle time), an inversion RF pulse is applied to the next slice between the inversion RF pulse 100 and excitation RF pulse 110 applied to the first slice #1.

Specifically, after application of the inversion RF pulse 100, inversion RF pulses are applied to a plurality of slices, such as an inversion RF pulse 101 to the second slice #2 and an inversion RF pulse 102 to the third slice #3. After each inversion recovery time TI, an excitation RF pulse 111 and a refocus RF pulse 121 or an excitation RF pulse 112 and a refocus RF pulse 122 are applied. In this way, the inversion RF pulses are applied in a nest-like fashion. While the pulses are depicted in a vertical arrangement in FIG. 3, the pulses are actually applied along the same time axis. Such pulse application is performed for all the slices, whereby echo signals are derived from all the slices, e.g. an echo signal S2 from the second slice #2, an echo signal S3 from the third slice #3 and so on.

The above sequence is repeated predetermined times (e.g. 256 times) with varied phase encode amounts after a long repetition time TR (e.g. TR=6000 to 10000 ms) for allowing the inverted longitudinal magnetization of water in each slice to return to an original magnitude. A k-space corresponding to each slice is filled with data acquired from echo signals generated through each pulse sequence.

The first apparatus described above provides T2-weighted images with suppressed water signal strength. Slice images thereby obtained have excellent contrast for detecting lesions adjacent cerebrospinal fluid close to the surface, ventricle and the like of the brain.

The first apparatus has the advantage noted above, but also has the following disadvantage.

Only one of the slices #1-#n (i.e. a slice of interest) has all the spins inverted by the inversion RF pulses 100, 101, 102 and so on. "Water" outside the slice of interest and not irradiated with inversion RF pulses may flow into the slice of interest in time of excitation of the slice of interest (at the points of time excitation RF pulses 110, 111, 112 and so on are applied). Then the water with longitudinal magnetization in the large initial state is excited to produce strong echo signals after application of refocus RF pulses 120, 121, 122 and so on, which form artifacts in resulting images.

The second apparatus will be described next with reference to FIGS. 4 and 5. FIG. 4 is a schematic view showing slices. FIG. 5 is a time chart showing a pulse sequence. In FIG. 5, gradient field pulses are omitted for expediency of description.

The first apparatus described above applies slice selective pulses, that is inversion RF pulses 100, 101, 102 and so on are applied to the slices, each to invert the spins of protons included in only one of the slices. In the second apparatus, as described hereinafter, inversion RF pulses are applied as slice non-selective pulses.

As shown in FIG. 4, an inversion RF pulse is applied to invert an entire region AE including a plurality of slices #1-#n, in order to invert simultaneously all the spins of protons included in the range encompassing the slices #1-#n. Specifically, the spins of protons included in the region AE are inverted by applying an inversion RF pulse having a wide frequency band for selecting the region AE according to a gradient magnetic field.

A pulse sequence by the FLAIR technique using such a slice non-selective pulse is as shown in FIG. 5A, for example.

First, an inversion RF pulse 200 is applied, which has a frequency band for inverting all the spins of protons included in the region AE shown in FIG. 4. After a predetermined time, an excitation RF pulse 210 is applied along with a slice-selecting gradient field pulse, not shown, for selecting the first slice #1 (slice of interest). Then, a refocus RF pulse 220 is applied to generate an echo signal S1 from the first slice #1 (FIG. 5B). Subsequently, without applying the inversion RF pulse 200, an excitation RF pulse 211 and a refocus RF pulse 221, ..., and an excitation RF pulse 214 and a refocus RF pulse 224 are applied to generate echo signal S2, ..., echo signal Sn−1 and echo signal Sn (FIG. 5B). After a repetition time TR, the above pulse sequence is repeated predetermined times by varying strength of a phase encoding gradient field pulse not shown.

As noted above, the inversion RF pulse 200 is applied as a slice non-selective pulse to invert the spins of protons in the region AE all together. This step achieves a simultaneous inversion of all spins of protons in water present in all of the slices #1-#n and between adjacent slices. Strong signals are not generated even when the water flows into slices of interest excited by the excitation RF pulses 210-215. No artifacts occur due to the incoming water.

In the second apparatus described above, the inversion RF pulse 200 for inverting all the spins of protons is applied only at the beginning of the pulse sequence. The excitation RF pulses and refocus RF pulses are applied subsequently to generate echo signals from the respective slices. The spins of protons are inverted 180 degrees at the point of time the inversion RF pulse 200 is applied, and recover the original longitudinal magnetization with a time constant of longitudinal relaxation time. As noted hereinbefore, the magnitude of longitudinal magnetization is different between "tissue" and "water". The recovery is made along the longitudinal relaxation curve CT or CW in each case (time constant for longitudinal relaxation curve CT<time constant for longitudinal relaxation curve CW). Thus, with passage of time after application of the inversion RF pulse 200, the longitudinal magnetization increases at different rates for "tissue" and "water". Consequently, each of the echo signals S1-Sn generated from the respective slices of interest excited by the excitation RF pulses 210-215 has different signal strengths for "tissue" and "water".

That is, the echo signal S3 generated by the excitation RF pulse 212 applied when the longitudinal magnetization of "water" is substantially zero contains relaxation information having a sufficiently large longitudinal magnetization of "tissue" and a sufficiently small longitudinal magnetization of "water". This results in a T2-weighted image with suppressed water signal strength when the TE is set to be long. In the echo signal S1 generated by the preceding excitation RF pulse 210, the recovery of the longitudinal magnetization of "tissue" is insufficient and a T2-weighted image cannot be obtained. In the echo signal Sn generated by the excitation RF pulse 215 applied at a later time, the longitudinal magnetization of "tissue" is sufficiently large but that of "water" is also large. It is therefore impossible to obtain a T2-weighted image with suppressed water signal strength.

As a result, contrast is variable from slice to slice. An effective contrast level of T2-weighted images with suppressed water signal strength is available only for those slice images based on the excitation RF pulse 212 and immediately preceding and succeeding excitation RF pulses which are applied when the longitudinal magnetization of "water" is substantially zero. This constitutes a disadvantage of limiting the number of slices for which effective contrast is secured. Where contrast is variable from slice to slice, a proper diagnosis may be difficult to make by observing a plurality of slice images depicting the same tissue because of varied levels of contrast. It is of great benefit to secure a substantially uniform level of contrast for a plurality of slice images.

SUMMARY OF THE INVENTION

This invention has been made having regard to the state of the art noted above, and its object is to provide an MR imaging method and apparatus for enabling an increased number of slice images having effective contrast, while avoiding artifacts due to influx of water, based on signals collected by exciting a plurality of slices in a predetermined order or in an order reversed therefrom, with signal strength corrected for data of each slice by adding data of the same slice thereto.

The above object is fulfilled, according to this invention, by an MR imaging method using NMR phenomenon, comprising the steps of:

(a) emitting a first group of RF pulses including a first inversion RF pulse having a frequency band for inverting proton spins included in a plurality of slices, and first excitation RF pulses emitted at predetermined points of time following the first inversion RF pulse to excite a plurality of slices in a predetermined order;

(b) emitting slice-selecting gradient field pulses based on emission timing of the RF pulses in the first group of RF pulses;

(c) emitting phase-encoding gradient field pulses for phase-encoding echo signals generated by the first excitation RF pulses, respectively;

(d) applying reading gradient field pulses to echo signals generated by the first group of RF pulses to read and collect a first group of echo signals successively;

(e) emitting a second group of RF pulses including a second inversion RF pulse having substantially the same frequency band as the first inversion RF pulse, and second excitation RF pulses emitted at predetermined points of time following the second inversion RF pulse to excite the plurality of slices in an order reverse to the predetermined order;

(f) emitting slice-selecting gradient field pulses based on emission timing of the RF pulses in the second group of RF pulses;

(g) emitting phase-encoding gradient field pulses for phase-encoding echo signals generated by the second excitation RF pulses, respectively;

(h) applying reading gradient field pulses to echo signals generated by the second group of RF pulses to read and collect a second group of echo signals successively;

(i) repeating a pulse sequence from step (a) to step (h), predetermined times, while varying the phase-encoding gradient field pulses emitted at steps (c) and (g);

(j) adding two data corresponding to each slice, which data are included, respectively, in a first group of data acquired from the first group of echo signals and in a second group of data acquired from the second group of echo signals, thereby forming a new group of data; and (k) reconstructing a plurality of slice images from the new group of data.

In the above method, a first group of RF pulses is emitted first (step (a)). This group of pulses includes one inversion RF pulse having a frequency band for inverting proton spins included in a plurality of slices. At predetermined points of time following the inversion RF pulse, excitation RF pulses are applied to excite a plurality of slices in a predetermined order.

Simultaneously with the excitation RF pulses, slice-selecting gradient field pulses are emitted to select one slice after another (step (b)). Phase-encoding gradient field pulses are emitted for phase-encoding echo signals, respectively (step (c)). Reading gradient field pulses are applied to the echo signals to read a first group of echo signals successively (step (d)).

In this way, the inversion RF pulse is applied as a slice non-selective pulse to invert the spins of protons included in all slices. The excitation RF pulses applied subsequently generate a plurality of echo signals from the respective slices, which are collected as a first group of echo signals. The echo signals in the first group are generated from the respective slices, and have different signal strengths for "tissue" and "water" due to the order of excitation by the excitation RF pulses. That is, the period of time (inversion recovery time) from the point of time the spins are inverted to the time of excitation becomes progressively longer in the order of excitation, and longitudinal magnetization, or signal strength, of "tissue" and "water" varies accordingly.

Next, a second group of RF pulses is emitted (step (e)). The second group includes one inversion RF pulse having substantially the same frequency band as the inversion RF pulse in the first group. At predetermined points of time following this inversion RF pulse, excitation RF pulses are emitted to excite the plurality of slices in an order reverse to the predetermined order noted above.

Simultaneously with these excitation RF pulses, slice-selecting gradient field pulses are emitted to select one slice after another (step (f)). Phase-encoding gradient field pulses are emitted for phase-encoding echo signals, respectively (step (g)). Reading gradient field pulses are applied to the echo signals to read a second group of echo signals successively (step (h)).

The echo signals in the second group are generated from the respective slices, and have different signal strengths for "tissue" and "water" due to the order of excitation by the excitation RF pulses, as do the echo signals in the first group. The inversion recovery time becomes progressively longer in the order of excitation, and longitudinal magnetization, or signal strength, of "tissue" and "water" varies accordingly.

The above pulse sequence is repeated predetermined times while varying the phase-encoding gradient field pulses (step (i)).

Of a first group of data acquired from the first group of echo signals and a second group of data acquired from the second group of echo signals, two data corresponding to each slice are added to form a new group of data (step (j)).

The first group of data is obtained by exciting the plurality of slices in the predetermined order. The second group of data is obtained by exciting the slices in the order reverse to the predetermined order. For example, the first slice is what is excited first in the first group of data, but is what is excited last (i.e. nth) in the second group of data.

Thus, the data of each slice reflect the longest inversion recovery time and the shortest one. Through the adding step, the two inversion recovery times are added to approach an inversion recovery time at a point of time at which the longitudinal magnetization of "water" is substantially zero. For example, data with the shortest inversion recovery time has a positive signal strength of "tissue" and a negative signal strength of "water". Data with the longest inversion recovery time has a positive signal strength of "tissue" and a positive signal strength of "water". When these data are added, the signal strength of "tissue" remains positive, but that of "water" is approximated to zero through a mutual cancellation of negative and positive.

As noted above, two data of each slice obtained by reversing the order of excitation are added to form a new group of data. All data are corrected in a way to suppress only the signal strength of "water" without lowering the signal strength of "tissue". Further, the short and long inversion recovery times are added for all data, such that all of the added inversion recovery times are made substantially the same. By reconstructing a plurality of slice images from the new group of data (step (k)), the slice images have a substantially uniform level of contrast.

According to another aspect of this invention, an MR imaging apparatus using NMR phenomenon is provided, which comprises:

(a) a main magnet for generating a uniform static magnetic field in an imaging space;

(b) a first, a second and a third gradient field coils attached to the main magnet for generating three types of gradient field pulses, i.e. slice-selecting gradient field pulses, reading gradient field pulses and phase-encoding gradient field pulses, with magnetic strengths varying in three orthogonal directions in the imaging space;

(c) a RF coil for emitting RF pulses to an examinee placed in the imaging space, and detecting echo signals generated from the examinee;

(d) a RF emitting device for successively emitting, through the RF coil, a first group of RF pulses including a first inversion RF pulse having a frequency band for inverting proton spins included in a plurality of slices, and first excitation RF pulses emitted at predetermined points of time following the first inversion RF pulse to excite a plurality of slices in a predetermined order, and a second group of RF pulses including a second inversion RF pulse having substantially the same frequency band as the first inversion RF pulse, and second excitation RF pulses emitted at predetermined points of time following the second inversion RF pulse to excite the plurality of slices in an order reverse to the predetermined order;

(e) a gradient field control device connected to the first, second and third gradient field coils and operable, based on emission timing of the RF pulses in the first group of RF pulses and the second group of RF pulses from the RF coils, for applying slice-selecting gradient field pulses through the first gradient field coil, applying phase-encoding gradient field pulses through the second gradient field coil, and applying reading gradient field pulses through the third gradient field coil to echo signals generated by the RF pulses, thereby forming a pulse sequence, the pulse sequence being repeated predetermined times while varying the phase-encoding gradient field pulses;

(f) an adding device for successively reading, through the RF coil, a first group of echo signals and a second group of echo signals generated by the first group of RF pulses and the second group of RF pulses, respectively, and adding two data corresponding to each slice, which data are included, respectively, in a first group of data acquired from the first group of echo signals and in a second group of data acquired from the second group of echo signals, thereby forming a new group of data; and (g) a data processing device for reconstructing a plurality of slice images from the new group of data.

An examinee or patient is placed in the image space where a uniform static magnetic field is formed by the main magnet, and RF pulses are applied to the examinee through the RF coil. This RF pulse application is carried out and controlled by the RF emitting device as follows.

First, the RF emitting device emits a first group of RF pulses. This group of pulses includes one inversion RF pulse having a frequency band for inverting proton spins included in a plurality of slices. At predetermined points of time following the inversion RF pulse, excitation RF pulses are emitted to excite a plurality of slices in a predetermined order.

Simultaneously with the excitation RF pulses, slice-selecting gradient field pulses are emitted through the first gradient field coil to select one slice after another. Phase-encoding gradient field pulses are emitted through the second gradient field coil for phase-encoding echo signals, respectively. Reading gradient field pulses are applied through the third gradient field coil to the echo signals to read a first group of echo signals successively. These first, second and third gradient field coils are controlled by the gradient field control device.

The inversion RF pulse is applied as a slice non-selective pulse to invert the spins of protons included in all slices. The excitation RF pulses applied subsequently generate a plurality of echo signals from the respective slices, which are collected by the RF coil as a first group of echo signals. The echo signals in the first group are generated from the respective slices, and have different signal strengths for "tissue" and "water" due to the order of excitation by the excitation RF pulses. That is, the period of time (inversion recovery time) from the point of time the spin is inverted to the time of excitation becomes progressively longer in the order of excitation, and longitudinal magnetization, or signal strength, of "tissue" and "water" varies accordingly.

Next, the RF emitting device emits a second group of RF pulses. The second group includes one inversion RF pulse having substantially the same frequency band as the inversion RF pulse in the first group. At predetermined points of time following this inversion RF pulse, excitation RF pulses are emitted to excite the plurality of slices in an order reverse to the predetermined order noted above.

Simultaneously with these excitation RF pulses, slice-selecting gradient field pulses are emitted through the first gradient field coil to select one slice after another in the reverse order. Phase-encoding gradient field pulses are emitted through the second gradient field coil for phase-encoding echo signals, respectively, as in the case of the first group of RF pulses. Reading gradient field pulses are applied through the third gradient field coil to the echo signals.

The echo signals generated by the excitation RF pulses as above are collected by the RF coil as a second group of echo signals. The echo signals in the second group are generated from the respective slices, and have different signal strengths for "tissue" and "water" due to the order of excitation by the excitation RF pulses, as do the echo signals in the first group. The inversion recovery time becomes progressively longer in the order of excitation, and longitudinal magnetization, or signal strength, of "tissue" and "water" varies accordingly.

Of a first group of data acquired from the first group of echo signals and a second group of data acquired from the second group of echo signals, the adding device adds two data corresponding to each slice to form a new group of data. The first group of data is obtained by exciting the plurality of slices in the predetermined order. The second group of data is obtained by exciting the slices in the order reverse to the predetermined order. For example, the first slice is what is excited first in the first group of data, but is what is excited last (i.e. nth) in the second group of data.

Thus, the data of each slice reflect the longest inversion recovery time and the shortest one. Through the adding step, the two inversion recovery times are added to approach an inversion recovery time at a point of time at which the longitudinal magnetization of "water" is substantially zero. For example, data with the shortest inversion recovery time has a positive signal strength of "tissue" and a negative signal strength of "water". Data with the longest inversion recovery time has a positive signal strength of "tissue" and a positive signal strength of "water". When these data are added, the signal strength of "tissue" remains positive, but that of "water" is approximated to zero through a mutual cancellation of negative and positive.

As noted above, two data of each slice obtained by reversing the order of excitation are added to form a new group of data. All data are corrected in a way to suppress only the signal strength of "water" without lowering the signal strength of "tissue". Further, the short and long inversion recovery times are added for all data, such that all of the added inversion recovery times are made substantially the same. A plurality of slice images reconstructed from the new group of data by the data processing device have a substantially uniform level of contrast.

As noted above, the first group of RF pulses excites a plurality of slices in a predetermined order, and the second group of RF pulses excites the slices in the order reverse to the predetermined order. Of the first and second groups of data acquired from the first and second groups of echo signals thereby collected, two data corresponding to each slice are added to form a new group of data. That is, the long and short inversion recovery times are added together since two data of each slice obtained by reversing the order of excitation are added to form a new group of data. All data are corrected in a way to suppress only the signal strength of "water" without lowering the signal strength of "tissue".

Further, the short and long inversion recovery times are added for all data, such that all of the added inversion recovery times are made substantially the same. By reconstructing a plurality of slice images from the new group of data, the slice images have a substantially uniform level of contrast. Thus, an increased number of slice images with effective contrast are secured for forming water-suppressed T2-weighted images. Further, since a slice non-selective pulse is used as the inversion RF pulse, the invention effectively avoids artifacts due to water flowing into excited slices.

Preferably, the RF emitting device is operable for differentiating emission timing of the first excitation RF pulses and emission timing of the second excitation RF pulses.

The groups of echo signals generated by the first and second groups of RF pulses, after being inverted by the respective inversion RF pulses, return to the original state according to longitudinal relaxation curves. As is well known, the longitudinal relaxation curves change exponentially. By differentiating emission timing of the first excitation RF pulses and emission timing of the second excitation RF pulses, the process of adding data of each slice generated by the first and second groups of RF pulses results in increased signal strength of "tissue" and makes the signal strength of "water" closer to zero. This provides T2-weighted images with a further suppression of water.

It is further preferred that the RF emitting device is operable for emitting the first inversion RF pulse and the second inversion RF pulse each having a frequency band for inverting proton spins included only in each of groups of slices resulting from the plurality of slices divided by a predetermined number, the pulse sequence being executed for each of the groups of slices.

By dividing the plurality of slices by a predetermined number to divide a region to be inverted into a plurality of regions, the excitation RF pulses may be applied only immediately before and after a point of time at which the longitudinal relaxation curve of water is zero. It is then possible to increase the number of data for approximating the signal strength of water to zero when added. This realizes an increased number of slices having effective contrast.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIG. 1 is a schematic view showing slices, which is used for describing a first conventional apparatus;

FIGS. 2A through 2C are a time chart illustrating the FLAIR technique;

FIGS. 7A through 7E are a time chart showing a portion of a pulse sequence according to this invention;

FIG. 8 is a schematic view showing slices, which is used for describing this invention;

FIG. 9 is a flow chart of a data collecting process according to this invention;

FIGS. 10A through 10C are a time chart showing the pulse sequence according to this invention;

FIG. 17 is a flow chart of another modified data collecting process.

DESCRIPTION OF THE PREFERRED EMBODIMENTS

Preferred embodiments of this invention will be described in detail hereinafter with reference to the drawings.

Figure 3:
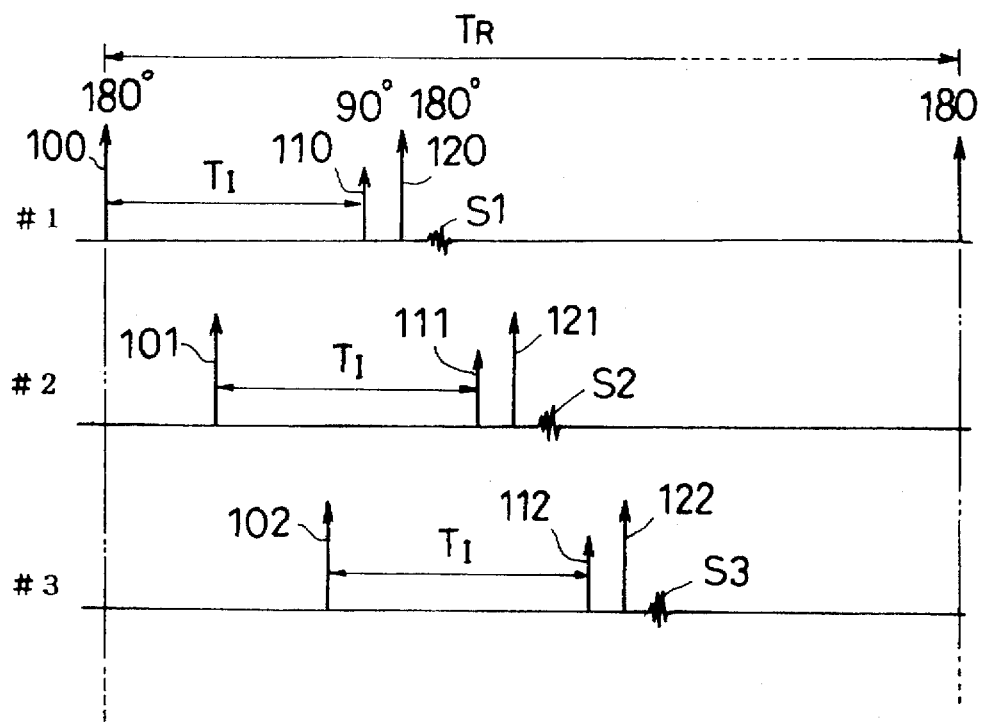
FIG. 3 is a time chart showing a pulse sequence by the FLAIR technique.
Figure 4:
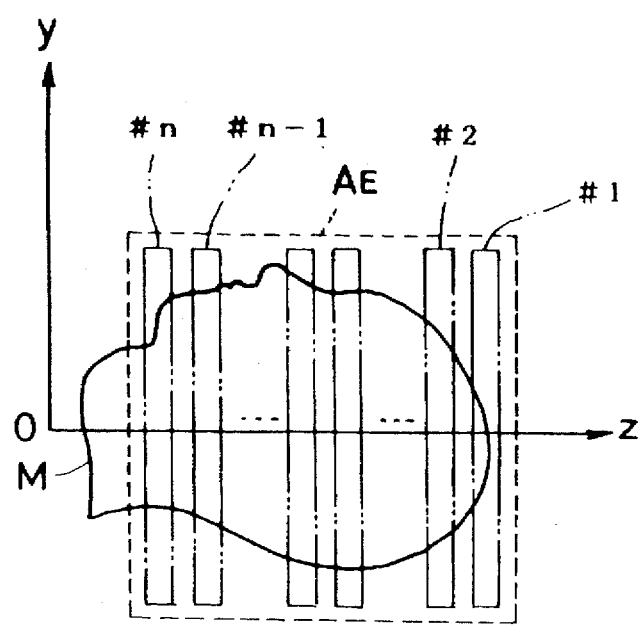
FIG. 4 is a schematic view showing slices, which is used for describing a second conventional apparatus.
Figure 5:
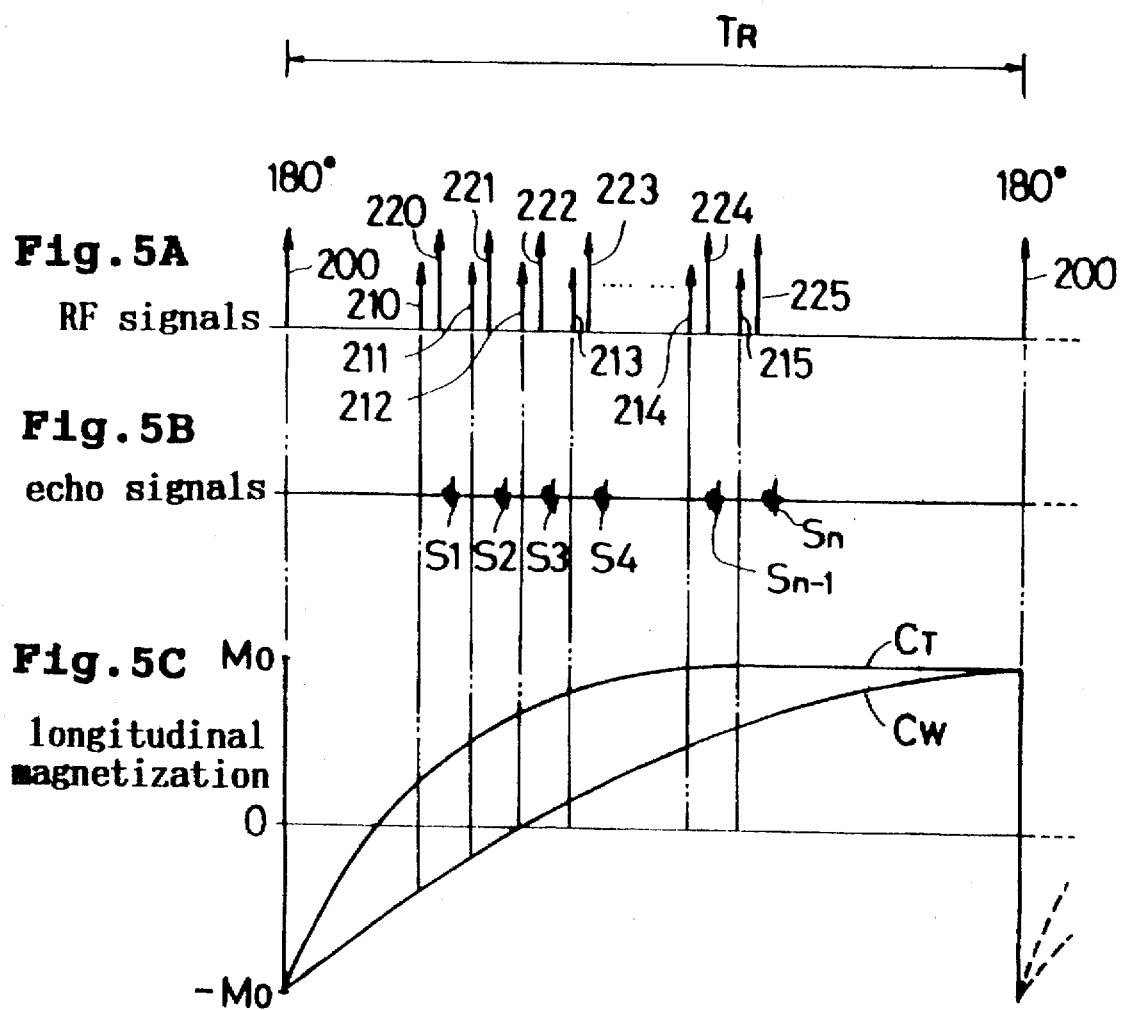
FIGS. 5A through 5C are a time chart showing a pulse sequence in the prior art.
Figure 6:
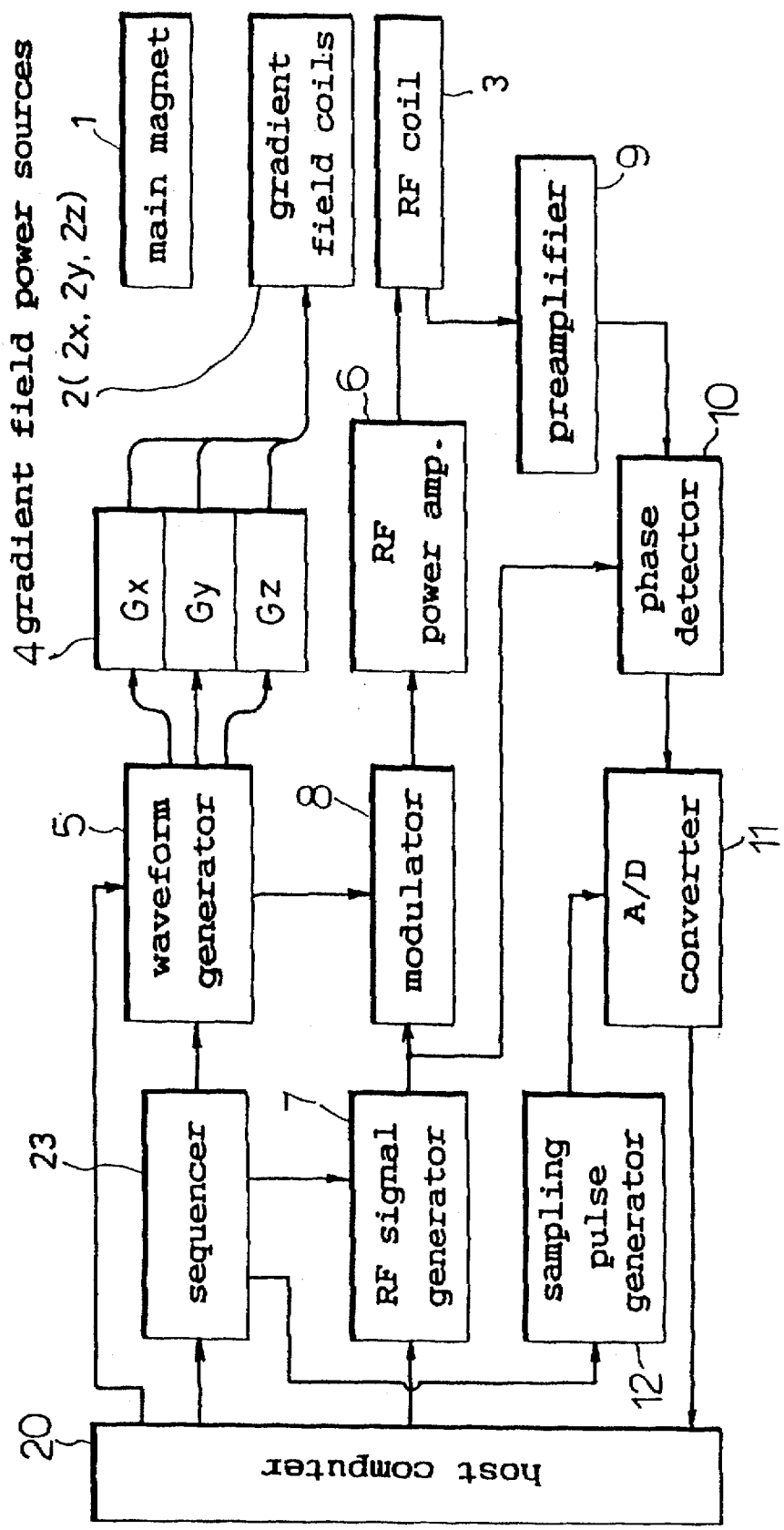
FIG. 6 is a block diagram of an MR imaging apparatus according to this invention.

The MR imaging apparatus shown in FIG. 6 will be described first. The apparatus includes a main magnet 1 for forming a static magnetic field, and three gradient field coils 2 (i.e. 2x, 2y and 2z) for superimposing gradient magnetic fields on the static magnetic field. The three gradient field coils 2x, 2y and 2z superimpose, on the uniform static field formed by the main magnet 1, pulses for three gradient fields Gp, Gr and Gs, i.e. a phase-encoding gradient field pulse, a reading gradient field pulse, and a slice-selecting gradient field pulse, each having a field strength varying in three orthogonal directions (X, Y and Z). An examinee (patient), not shown, is placed in a space where the static and gradient fields are formed, with a RF coil 3 attached to the examinee.

Gradient field power sources 4 are connected to the gradient field coils 2 to supply power for generating the gradient fields Gx, Gy and Gz. The gradient field power sources 4 receive waveform signals from a waveform generator 5 to control waveforms of the gradient fields Gx, Gy and Gz. The RF coil 3 receives a RF signal from a RF power amplifier 6 to irradiate the examinee with the RF signal. This RF signal results from an amplitude modulation effected by a modulator 8, according to a waveform received from the waveform generator 5, on a RF signal of a predetermined carrier frequency generated by a RF signal generator 7.

The RF coil 3 receives NMR signals generated in the examinee, and transmits these signals through a preamplifier 9 to a phase detector 10. The phase detector 10 detects phases of the signals received, using the RF signal from the RF signal generator 7 as a reference frequency. Results of the detection are outputted to an analog-to-digital (A/D) converter 11. The A/D converter 11 also receives sampling pulses from a sampling pulse generator 12 for use in converting the detection results into digital data. The digital data are given to a host computer 20.

The host computer 20, which acts as the adding device and data processing device, processes the data to reconstruct images, and determines timing of an overall sequence through a sequencer 23. That is, the sequencer 23, under the control of the host computer 20, transmits timing signals to the waveform generator 5, RF signal generator 7 and sampling pulse generator 12 to determine timing of waveform signal output from the waveform generator 5, timing of RF signal generation by the RF signal generator 7, and timing of sampling pulse generation by the sampling pulse generator 12. Further, the host computer 20 transmits waveform information to the waveform generator 5 to control the waveform, strength and the like of the pulses for the gradient fields Gx, Gy and Gz, and to determine an envelope of the RF signal emitted from the RF coil 3 to the examinee. The host computer 51 also transmits a signal to the RF signal generator 7 to control the carrier frequency of the RF signal. Thus, the host computer 20 controls the overall pulse sequence based on the FLAIR technique.

The above MR imaging apparatus, under control of the computer 20 and sequencer 23, applies RF signals and the pulses for three gradient fields Gs, Gr and Gp as shown in FIGS. 7A–7E. These figures show only the first RF pulse for acquiring an echo signal from a first slice #1 (or nth slice #n) as shown in FIG. 8, in a first group of RF pulses (or second group of RF pulses) in the pulse sequence described hereinafter.

As shown in FIG. 7A, an inversion RF pulse 300 is applied to invert 180 degrees all spins of protons placed in a predetermined direction by the static magnetic field. This inversion RF pulse 300 has a frequency band for inverting all the spins of protons included in a region AE encompassing all of the slices #1-#n as shown in FIG. 8. A pulse 400 for forming a slice-selecting gradient field Gs (shown in a dotted line in FIG. 7B) of weak field strength may be applied simultaneously. In this case, its strength is adjusted so that the inversion is made for the region AE.

Upon lapse of a predetermined time from a point of time the inversion RF pulse 300 is applied, an excitation RF pulse 310 (also called 90-degree pulse since it rotates the spin phase of protons 90 degrees) is applied along with a pulse 401 for forming a slice-selecting gradient field Gs (FIG. 7B). The pulse 401 has a frequency band for selecting only the first slice #1 (or an nth slice #n) from among the plurality of slices.

Upon lapse of a predetermined time from the point of time the excitation RF pulse 310 is applied, a refocus RF pulse 320 (also called 180-degree pulse since it rotates the spin of protons 180 degrees) is applied along with a pulse 402 for forming a slice-selecting gradient field Gs to select only the first slice #1 (or the nth slice #n).

As a result of the above RF pulse application, as shown in FIG. 7E, a spin echo is generated around a point of time at which an echo delay time TE elapses, which is twice a period between excitation RF pulse 310 and refocus RF pulse 320. Prior to generation of the spin echo, as shown in FIG. 7D, a pulse 500 is applied to form a phase-encoding gradient field Gp of predetermined strength. Then, a pulse 600 is applied to form a reading gradient field Gr (FIG. 7C), thereby generating a gradient echo signal S1 coincidental with the spin echo. Data is collected from the signal after an analog-to-digital conversion.

A data collecting process will be described next with reference to the flow chart shown in FIG. 9. It is assumed here that the pulses for forming phase-encoding gradient fields have a predetermined strength.

At step S1, a first group of RF pulses is applied to collect a group of echo signals. As shown in FIG. 10A, the first group of RF pulses is a group of pulses G1 including one inversion RF pulse 300 and pulse pairs P1-Pn each consisting of the excitation RF pulse 310 and refocus RF pulse 320 shown in FIG. 7A. These pulse pairs P1-Pn are applied along with the pulses 401 and 402 for forming slice-selecting gradient fields Gs (shown in FIG. 7B), to excite the first to nth slices #1-#n in the order DF shown in FIG. 8. The first group of pulses G1 causes generation of echo signals S1-Sn, and pulses 600 for forming reading gradient fields Gr are applied as shown in FIG. 7C to collect data from the echo signals S1-Sn. The group of data thus collected is a first group of data.

At step S2, a second group of RF pulses is applied to collect a group of echo signals. As shown in FIG. 10A, the second group of RF pulses is a group of pulses G2 including pulse pairs P1-Pn as does the first group of RF pulses G1. These pulse pairs P1-Pn are applied in the order reverse to that of the first group of pulses G1 (i.e. applied in the order of pulses Pn to P1). That is, as shown in FIG. 8, the slices are excited in the order DR from nth slice #n to first slice #1, that is the order of excitation is reversed, with the pulses 401 and 402 for forming slice-selecting gradient fields Gs applied as shown in FIG. 7B. The second group of pulses G2 causes generation of echo signals Sn-S1, and pulses 600 for forming reading gradient fields Gr are applied as shown in FIG. 7C to collect data (i.e. a second group of data) from the echo signals Sn-S1.

Step S3 is executed to determine whether the above sequence has been repeated predetermined times, and the operation is branched according to results of step S3. That is, the operation is branched depending on whether the sequence has been repeated a number of times (e.g. 256 times) necessary for filling up a k-space not shown. If the sequence has not been repeated predetermined times, step S4 is executed to vary the phase encode amount and the operation returns to step S1. Specifically, steps S1 and S2 are executed again by varying the strength of the pulse 500, shown in FIG. 7D, for forming the phase-encoding gradient field Gp.

If it is found at step S3 that the sequence has been completed predetermined times, the operation proceeds to step S5 to add the group of data (hereinafter called the first group of data) acquired from the first group of echo signals S1-Sn and that (hereinafter called the second group of data) acquired from the second group of echo signals Sn-S1. Specifically, among the first and second groups of data, two data corresponding to each slice are added together to form a new group of data.

Figure 11A:
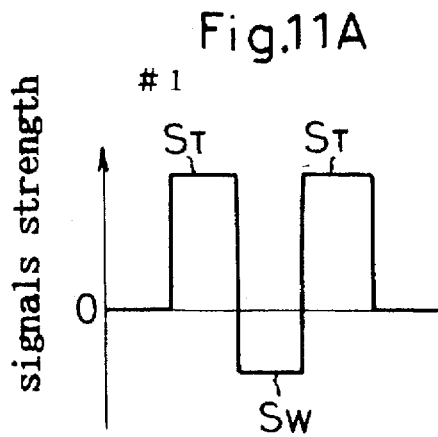
FIGS. 11A and 11B are schematic views showing signal strengths of data collected in a predetermined order.
Figure 11B:
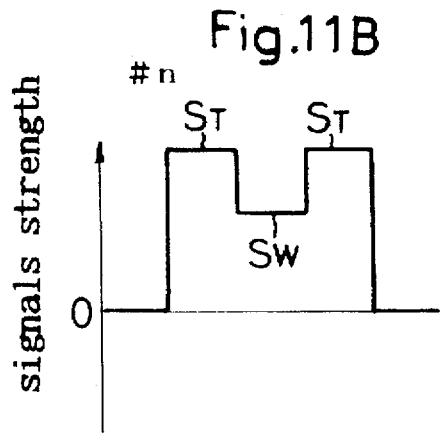
Figure 12A:
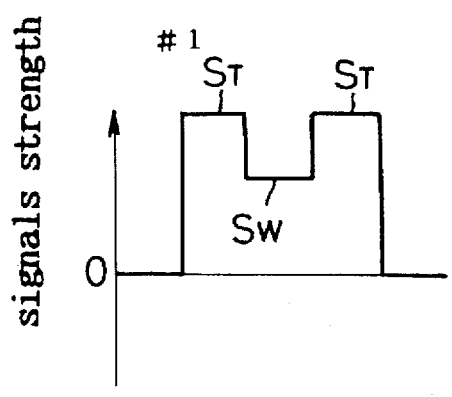
FIGS. 12A and 12B are schematic views showing signal strengths of data collected in a reversed order.
Figure 12B:
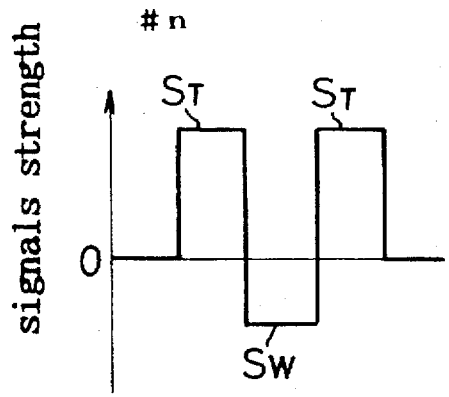

Reference is now made to FIGS. 11 and 12 schematically showing, by way of example, the first slice #1 and nth slice #n among the plurality of slices. FIGS. 11A and 11B show the first group of data acquired from the first group of echo signals generated by the first group of RF pulses G1. FIGS. 12A and 12B show the second group of data acquired from the second group of echo signals generated by the second group of RF pulses G2. It is assumed here that water is present between tissues, and reference ST in these figures denotes signals from "tissue", and reference SW denotes signals from "water".

In the first group of RF pulse G1, as shown in FIGS. 10A and 10B, the first slice #1 is excited first and has the shortest inversion recovery time TP1, while the nth slice #n is excited nth in order and has the longest inversion recovery time TPn. In the second group of RF pulses G2, the nth slice #n is excited first and has the shortest inversion recovery time TPn, while the first slice #1 is excited nth in order and has the longest inversion recovery time TP1. Consequently, based on the longitudinal magnetization curves CT and CW of "tissue" and "water" shown in FIG. 10C, the data acquired from the echo signal generating from the first slice #1 by the first group of RF pulses G1, as shown in FIG. 11A, has a relatively small positive value for the signal strength ST of "tissue" and a negative value for the signal strength SW of "water". The data acquired from the echo signal generating from the nth slice #n by the first group of RF pulses G1, as shown in FIG. 11B, has a relatively large positive value for the signal strength ST of "tissue" and a positive value for the signal strength SW of "water".

On the other hand, the data acquired from the echo signal generating from the first slice #1 by the second group of RF pulses G2, as shown in FIG. 12A, has a relatively large positive value for the signal strength ST of "tissue" and a positive value for the signal strength SW of "water". The data acquired from the echo signal generating from the nth slice #n by the second group of RF pulses G2, as shown in FIG. 12B, has a relatively small positive value for the signal strength ST of "tissue" and a negative value for the signal strength SW of "water".

Figure 13A:
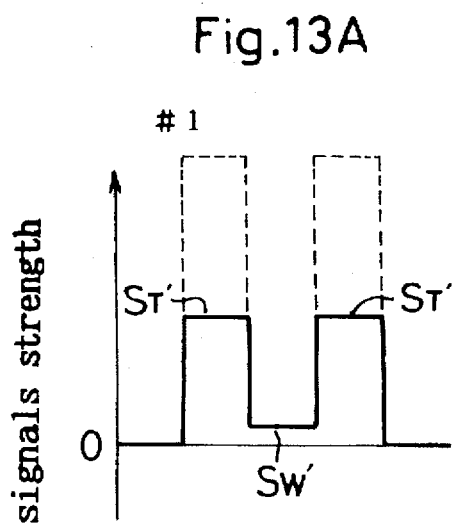
FIGS. 13A and 13B are schematic views showing signal strengths of data after addition.
Figure 13B:
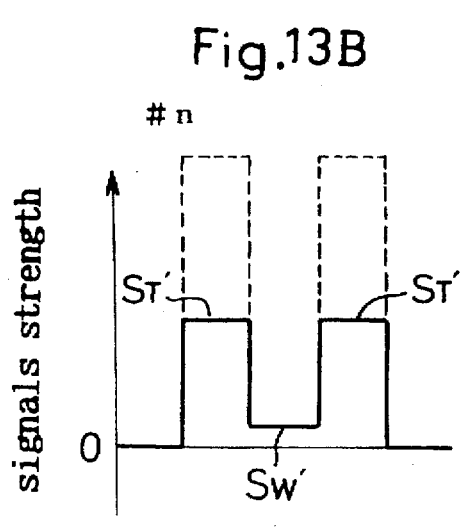

Then, the data acquired from the echo signal S1 generated by the first group of RF pulses G1 (FIG. 11A) and the data acquired from the echo signal S1 generated by the second group of RF pulses G2 (FIG. 12A) are added. Similarly, the data acquired from the echo signal Sn generated by the first group of RF pulses G1 (FIG. 11B) and the data acquired from the echo signal Sn generated by the second group of RF pulses G2 (FIG. 12B) are added. In this way, two data for each slice #1 or #n are added to form a new group of data. This adding process includes an averaging process besides the process of adding the two data for each slice (as depicted in dotted lines in FIGS. 13A and 13B). The averaging process suppresses noise in the echo signals to improve the signal-to-noise ratio. The result is shown in FIGS. 13A and 13B. It will be seen that the signal strength ST' of "tissue" and the signal strength SW' of "water" present substantially the same profile of signal strength for the first slice #1 (FIG. 13A) and the nth slice #n (FIG. 13B).

This is achieved by reversing the order of excitation with the first group of RF pulses G1 and second group of RF pulses G2. The reversal of the order provides a substantially equal total inversion recovery time, and hence substantially equal longitudinal magnetization, for the respective slices. Further, the water signal strength SW' is suppressed to secure a difference from the tissue signal strength ST', thereby enabling reconstruction of water-suppressed, T2-weighted images. Data are added for each of the other slices as described above. At step S6, a plurality of slice images are reconstructed from the groups of data after the adding process, thereby realizing an increased number of slice images with effective contrast. Further, use of a slice non-selective pulse as the inversion RF pulse effectively avoids artifacts due to water flowing into excited slices.

In applying pulse pairs P1-Pn in each of the first group of RF pulses G1 and second group of RF pulses G2, an even number of pulse pairs, preferably, are applied before and after a pulse pair applied when the longitudinal relaxation curve CW is substantially at zero. That is, it is preferable to apply an odd number of pulse pairs in total. This achieves improved uniformity in the total inversion recovery time among the different slices after the adding process.

Figure 14A:
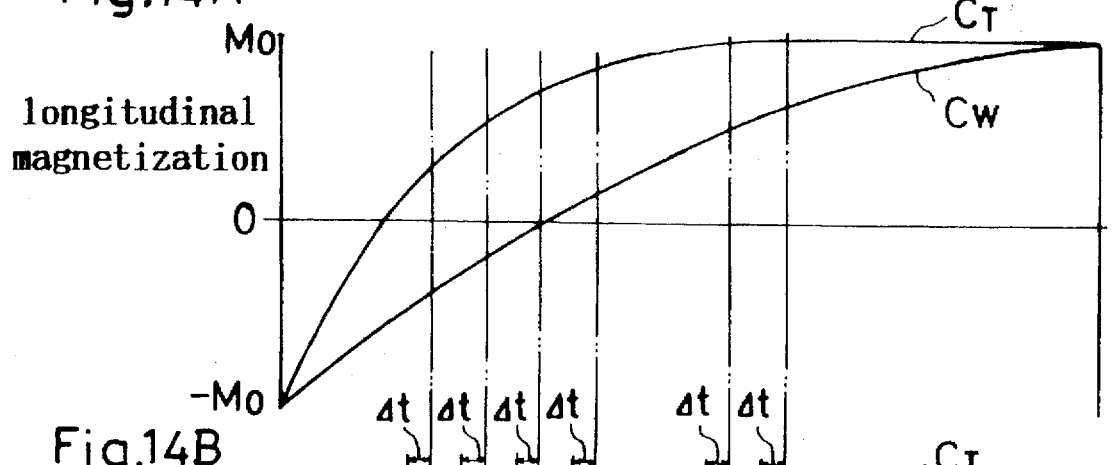
FIGS. 14A and 14B are a time chart showing a modified pulse sequence.
Figure 14B:
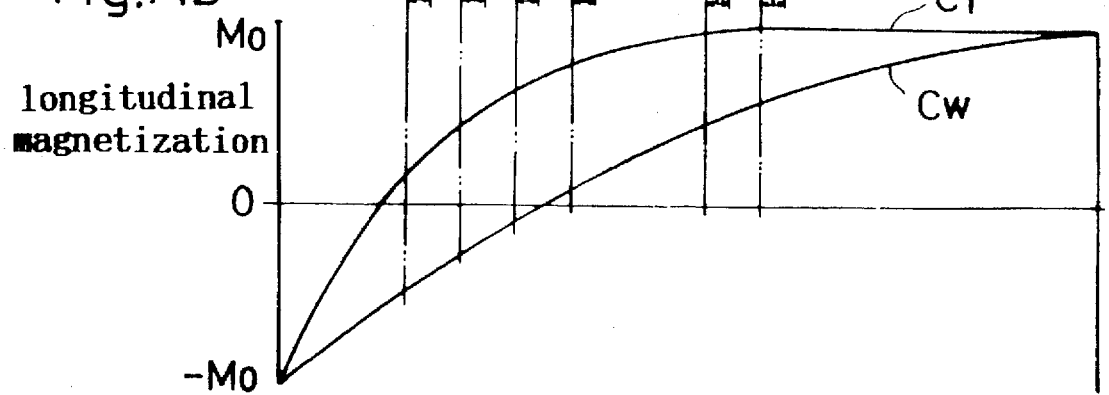

As is well known, the longitudinal relaxation curves CT and CW change exponentially rather than linearly. As shown in FIGS. 14A and 14B (which show only longitudinal magnetization), application of the first group of RF pulses G1 (FIG. 14A) and application of the second group of RF pulses G2 (FIG. 14B) may be staggered in time.

That is, the first pulse pair P1 in the first group of RF pulses G1 and the first pulse pair Pn in the second group of RF pulses G2 may be applied at different points of time from the inversion RF pulse 300 (see FIG. 10A). For example, the second group of RF pulses G2 is applied earlier than the first group of RF pulses G1 by Δt. This modification increases the signal strength of "tissue" and makes the signal strength of "water" still closer to zero, thereby providing T2-weighted images with a further suppression of water.

The pulse pairs Pn-P1 may be staggered by varied amounts according to the longitudinal relaxation curves changing exponentially, instead of being staggered all by the same amount Δt.

Figure 15:
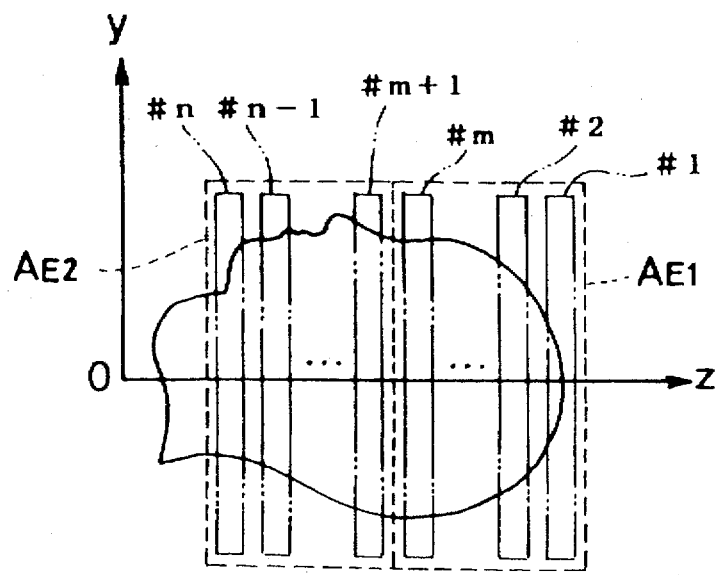
FIG. 15 is a schematic view showing a modified slice selection by an inversion RF pulse.

In the foregoing embodiment, one region is inverted by the slice non-selective pulse. This region may be divided into a selected number of parts. As shown in FIG. 15, for example, the region inverted by the slice non-selective pulse may be divided into a region AE1 (slices #1 to #m) and a region AE2 (slices #m+1 to #n), with the pulse sequence of FIG. 10A executed for each region. By dividing the region to be inverted into a plurality of regions as above, the pulse pairs may be applied only immediately before and after a point of time at which the longitudinal relaxation curve of water is zero. It is then possible to increase the number of data for approximating the signal strength of water to zero when added. This realizes an increased number of slices having effective contrast.

Figure 16:
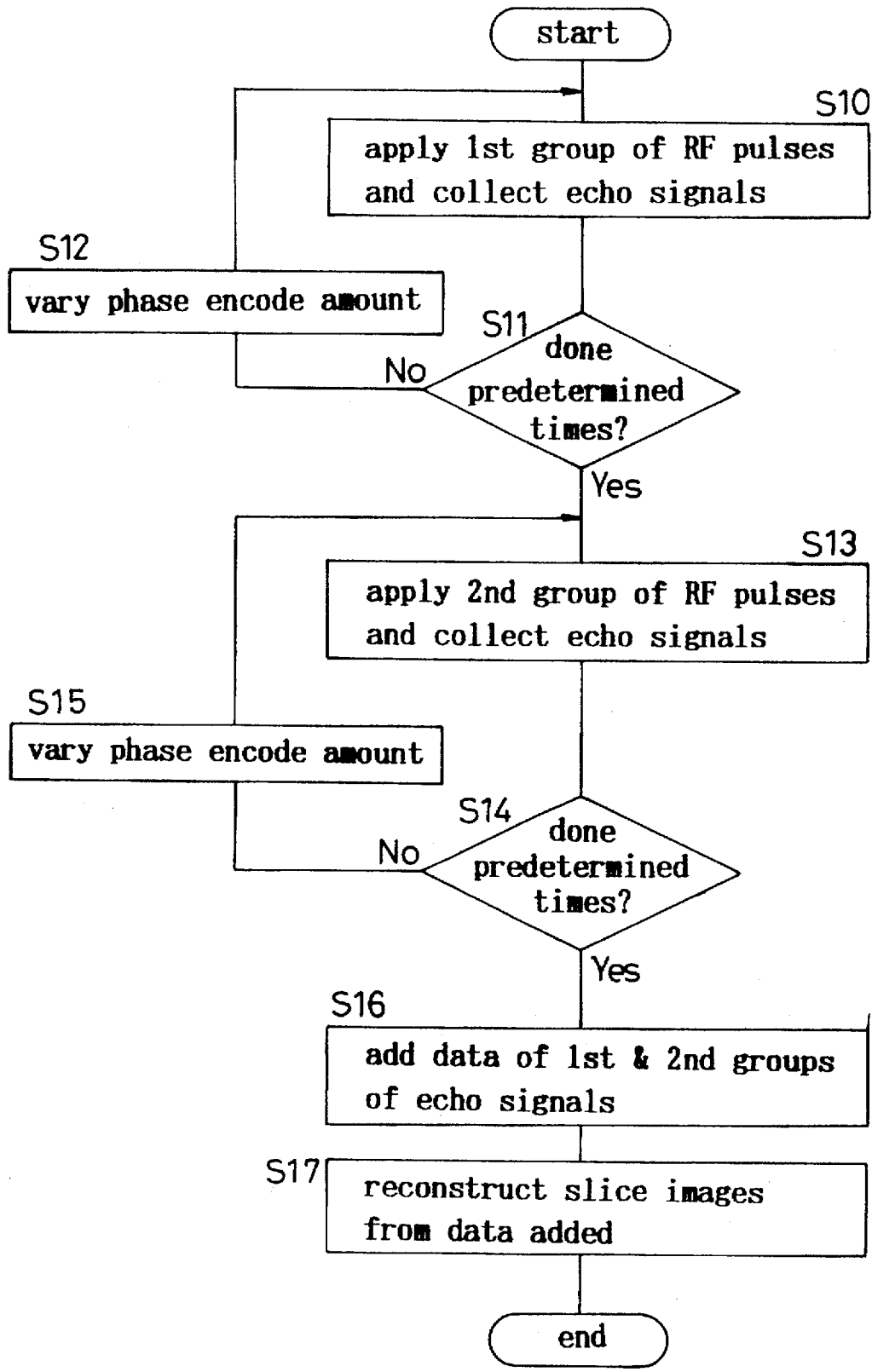
FIG. 16 is a flow chart of a modified data collecting process.

In the foregoing embodiment, the first group of RF pulses G1 is applied at step S1, the second group of RF pulses G2 is applied at step S2, and then the phase encode amount is varied at step S4. This process may be modified as shown in FIG. 16.

The first group of RF pulses is applied at step S10, which is repeated predetermined times with the phase encode amount varied at Step S12. Subsequently, the second group of RF pulses is applied at step S13 which is repeated predetermined times with the phase encode amount varied at step S15. After collecting echo signals in this way, step S16 is executed to add data. This modified process produces the same effect as in the foregoing embodiment.

Further, in the foregoing embodiment, the group of data acquired from the first group of echo signals and that acquired from the second group of echo signals are added at step S5, and images are reconstructed at step S6. This process may be modified as shown in FIG. 17.

At step S24, a first group of slice images is reconstructed from the group of data acquired from the first group of echo signals, and a second group of slice images is reconstructed from the group of data acquired from the second group of echo signals. At step S25, the first and second groups of slice images are added, whereby reconstructed images of each slice are added together. This modified process also produces the same effect as in the foregoing embodiment.

In the foregoing pulse sequence, for simplicity of description, the excitation RF pulse 310 is followed by one refocus RF pulse 320 to generate an echo signal combining a gradient echo signal and a spin echo signal coinciding with each other. Usually a plurality of refocus RF pulses are used to increase speed (Fast Spin Echo Technique).

It is also possible to apply only the excitation RF pulse 310, without applying the refocus RF pulse 320, to generate an echo signal including only a gradient echo signal.

The pulse pairs P1-Pn each including the excitation RF pulse 310 and refocus RF pulse 320 are applied at equal intervals of time. In each of the first group of RF pulses G1 and second group of RF pulses G2, the pulse pairs P1-Pn may be applied at unequal intervals, taking the longitudinal magnetization of tissue and water into account, in a way to increase the signal strength of tissue and approximate that of water to zero.

The present invention may be embodied in other specific forms without departing from the spirit or essential attributes thereof and, accordingly, reference should be made to the appended claims, rather than to the foregoing specification, as indicating the scope of the invention.

What is claimed is:

1. An MR imaging method using NMR phenomenon, comprising the steps of:
   (a) emitting a first group of RF pulses including a first inversion RF pulse having a frequency band for inverting proton spins included in a plurality of slices, and first excitation RF pulses emitted at predetermined points of time following said first inversion RF pulse to excite a plurality of slices in a predetermined order;
   (b) emitting slice-selecting gradient field pulses based on emission timing of said RF pulses in said first group of RF pulses;
   (c) emitting phase-encoding gradient field pulses for phase-encoding echo signals generated by said first excitation RF pulses, respectively;
   (d) applying reading gradient field pulses to echo signals generated by said first group of RF pulses to read and collect a first group of echo signals successively;

(e) emitting a second group of RF pulses including a second inversion RF pulse having substantially the same frequency band as said first inversion RF pulse, and second excitation RF pulses emitted at predetermined points of time following said second inversion RF pulse to excite said plurality of slices in an order reverse to said predetermined order;

(f) emitting slice-selecting gradient field pulses based on emission timing of said RF pulses in said second group of RF pulses;

(g) emitting phase-encoding gradient field pulses for phase-encoding echo signals generated by said second excitation RF pulses, respectively;

(h) applying reading gradient field pulses to echo signals generated by said second group of RF pulses to read and collect a second group of echo signals successively;

(i) repeating a pulse sequence from step (a) to step (h), predetermined times, while varying said phase-encoding gradient field pulses emitted at steps (c) and (g);

(j) adding two data corresponding to each slice, which data are included, respectively, in a first group of data acquired from said first group of echo signals and in a second group of data acquired from said second group of echo signals, thereby forming a new group of data; and (k) reconstructing a plurality of slice images from said new group of data.

2. A method as defined in claim 1, wherein step (i) is replaced by a step, executed after step (d), of repeating a pulse sequence from step (a) to step (d), predetermined times, while varying said phase-encoding gradient field pulses emitted at step (c), and a step, executed after step (h), of repeating a pulse sequence from step (e) to step (h), predetermined times, while varying said phase-encoding gradient field pulses emitted at step (g).

3. A method as defined in claim 1, wherein step (j) is replaced by a step of reconstructing a first group of slice images from a first group of data acquired from said first group of echo signals, and a second group of slice images from a second group of data acquired from said second group of echo signals, and step (k) is replaced by a step of adding two slice images corresponding to each slice, which slice images are included, respectively, in said first group of slice images and in said second group of slice images.

4. An MR imaging apparatus using NMR phenomenon, comprising:

(a) a main magnet for generating a uniform static magnetic field in an imaging space;

(b) a first, a second and a third gradient field coils attached to said main magnet for generating three types of gradient field pulses, i.e. slice-selecting gradient field pulses, reading gradient field pulses and phase-encoding gradient field pulses, with magnetic strengths varying in three orthogonal directions in said imaging space;

(c) a RF coil for emitting RF pulses to an examinee placed in said imaging space, and detecting echo signals generated from said examinee;

(d) RF emitting means for successively emitting, through said RF coil, a first group of RF pulses including a first inversion RF pulse having a frequency band for inverting proton spins included in a plurality of slices, and first excitation RF pulses emitted at predetermined points of time following said first inversion RF pulse to excite a plurality of slices in a predetermined order, and a second group of RF pulses including a second inversion RF pulse having substantially the same frequency band as said first inversion RF pulse, and second excitation RF pulses emitted at predetermined points of time following said second inversion RF pulse to excite said plurality of slices in an order reverse to said predetermined order;

(e) gradient field control means connected to said first, second and third gradient field coils and operable, based on emission timing of said RF pulses in said first group of RF pulses and said second group of RF pulses from said RF coils, for applying slice-selecting gradient field pulses through said first gradient field coil, applying phase-encoding gradient field pulses through said second gradient field coil, and applying reading gradient field pulses through said third gradient field coil to echo signals generated by said RF pulses, thereby forming a pulse sequence, said pulse sequence being repeated predetermined times while varying said phase-encoding gradient field pulses;

(f) adding means for successively reading, through said RF coil, a first group of echo signals and a second group of echo signals generated by said first group of RF pulses and said second group of RF pulses, respectively, and adding two data corresponding to each slice, which data are included, respectively, in a first group of data acquired from said first group of echo signals and in a second group of data acquired from said second group of echo signals, thereby forming a new group of data; and (g) data processing means for reconstructing a plurality of slice images from said new group of data.

5. An apparatus as defined in claim 4, wherein said gradient field control means is operable, based on emission timing of said RF pulses in said first group of RF pulses from said RF coils, for applying slice-selecting gradient field pulses through said first gradient field coil, applying phase-encoding gradient field pulses through said second gradient field coil, and applying reading gradient field pulses through said third gradient field coil to echo signals generated by said RF pulses, thereby forming a first pulse sequence, said first pulse sequence being repeated predetermined times while varying said phase-encoding gradient field pulses, and operable, based on emission timing of said RF pulses in said second group of RF pulses from said RF coils, for applying slice-selecting gradient field pulses through said first gradient field coil, applying phase-encoding gradient field pulses through said second gradient field coil, and applying reading gradient field pulses through said third gradient field coil to echo signals generated by said RF pulses, thereby forming a second pulse sequence, said second pulse sequence being repeated predetermined times while varying said phase-encoding gradient field pulses.

6. An apparatus as defined in claim 4, wherein said data processing means is operable for successively collecting, through said RF coil, said first group of echo signals and said second group of echo signals generated by said first group of RF pulses and said second group of RF pulses, respectively, reconstructing a first group of slice images from a first group of data acquired from said first group of echo signals, and reconstructing a second group of slice images from a second group of data acquired from said second group of echo signals, and said adding means is operable for adding two slice images corresponding to each slice, which slice images are included, respectively, in said first group of slice images and in said second group of slice images.

7. An apparatus as defined in claim 4, wherein said RF emitting means is operable for emitting said first group of RF pulses and said second group of RF pulses, each group including one inversion RF pulse and pulse pairs each having one refocus RF pulse.

8. An apparatus as defined in claim 4, wherein said RF emitting means is operable for equalizing emission timing of said first excitation RF pulses and emission timing of said second excitation RF pulses.

9. An apparatus as defined in claim 4, wherein said RF emitting means is operable for differentiating emission timing of said first excitation RF pulses and emission timing of said second excitation RF pulses.

10. An apparatus as defined in claim 4, wherein said RF emitting means is operable for emitting said first inversion RF pulse and said second inversion RF pulse each having a frequency band for inverting proton spins included only in each of groups of slices resulting from said plurality of slices divided by a predetermined number, said pulse sequence being executed for each of said groups of slices.

* * * * *